(12) United States Patent
Kamijima

(10) Patent No.: US 6,692,901 B2
(45) Date of Patent: Feb. 17, 2004

(54) METHOD FOR FABRICATING A RESIST PATTERN, A METHOD FOR PATTERNING A THIN FILM AND A METHOD FOR MANUFACTURING A MICRO DEVICE

(75) Inventor: Akifumi Kamijima, Chuo-Ku (JP)

(73) Assignee: TDK Corporation, Tokyo (JP)

(*) Notice: Subject to any disclaimer, the term of this patent is extended or adjusted under 35 U.S.C. 154(b) by 44 days.

(21) Appl. No.: 09/964,398

(22) Filed: Sep. 28, 2001

(65) Prior Publication Data
US 2002/0042028 A1 Apr. 11, 2002

(30) Foreign Application Priority Data
Oct. 5, 2000 (JP) .......................... 2000-305689

(51) Int. Cl.$^7$ ................................ G03C 5/00
(52) U.S. Cl. ............. 430/315; 430/311; 430/313; 430/319; 430/327
(58) Field of Search .............. 430/311, 313, 430/315, 319, 327

(56) References Cited

U.S. PATENT DOCUMENTS 4,814,258 A * 3/1989 Tam .......................... 430/315
5,725,997 A * 3/1998 Kamijima ................... 430/311

FOREIGN PATENT DOCUMENTS

JP    A 6-267843    9/1994

* cited by examiner

Primary Examiner—Christopher G. Young
(74) Attorney, Agent, or Firm—Oliff & Berridge, PLC

(57) ABSTRACT

A polymethylglutaramide layer is formed on a given base material, and then, the surface of the polymethylglutaramide layer is washed with an organic solvent. Then, a photoresist layer is formed on the polymethylglutaramide layer. The photoresist layer is exposed and developed. The remaining polymethylglutaramide layer is partially removed, to form a resist pattern having a T-shaped longitudinal cross section which is constructed of a main body having a substantially rectangular longitudinal cross section and a supplemental body to support the main body on a given base material. The supplemental body has a substantially rectangular longitudinal cross section, which is narrower than the longitudinal cross section of the main body.

17 Claims, 10 Drawing Sheets

METHOD FOR FABRICATING A RESIST PATTERN, A METHOD FOR PATTERNING A THIN FILM AND A METHOD FOR MANUFACTURING A MICRO DEVICE

BACKGROUND OF THE INVENTION

1. Field of the Invention

This invention relates to a method for fabricating a resist pattern, a method for patterning a thin film and a method for manufacturing a micro device.

2. Related Art Statement

Thin film-patterning is performed by using a milling method, a lift-off method or a combination method of milling and lift-off. As a resist pattern for the thin film-patterning, is employed a two-layered structure, that is, a Bi-layered type resist pattern which includes a photoresist layer as a top layer and a polymethylglutarimide layer (PMGI layer) as a bottom layer.

FIGS. 1–5 are cross sectional views showing the fabricating steps of the Bi-layered type resist pattern.

First of all, as shown in FIG. 1, a PMGI layer 3 is coated on a given base material 1 and heated as occasion demands. Then, as shown in FIG. 2, a photoresist layer 5 is coated on the PMGI layer 3, and heated as occasion demands. Thereafter, as shown in FIG. 3, the photoresist layer 5 is exposed via a given mask 7 through UV irradiation.

Thereafter, the exposed photoresist layer 5 is developed, and the remaining PMGI layer 3 is partially removed with an alkaline water solution, to form a resist pattern 9 as shown in FIG. 4 or a resist pattern 10 as shown in FIG. 10.

The main body 9-1 of the resist pattern 9 is made of the photoresist layer 5, and the supplemental body 9-2 thereof is made of the PMGI layer 3 and narrowed as compared with the main body 9-1. Similarly, the main body 10-1 of the resist pattern 10 is made of the photoresist layer 5, and the supplemental body 10-2 thereof is made of the PMGI layer 3.

In the case of patterning a thin film via the resist pattern 9 as shown in FIG. 4 by a milling method, a large amount of milled wastage may be stuck on the side surface walls of the supplemental body 9-2. Therefore, in the dissolving and solving step for the resist pattern 9, the penetration of solvent is blocked due to the stuck wastage of milling, and thus, the resist pattern 9 may not be perfectly dissolved and removed.

Moreover, if the bottom portion of the supplemental body 9-2 is enlarged in its width due to the stuck wastage of milling, the patterning condition of the thin film is affected.

Moreover, in the resist pattern 10 as shown in FIG. 5, the main body 10-1 can not be supported by the supplemental body 10-2, so that the main body 10-1 may come off in patterning a thin film.

It is an object of the present invention to provide a method for fabricating a resist pattern without the above-mentioned defects, and to provide a method for patterning a thin film and a method for manufacturing a micro device which uses a resist pattern obtained through the fabricating method.

In order to achieve the above object, this invention relates to A method for fabricating a resist pattern having a T-shaped longitudinal cross section which is constructed of a main body having a substantially rectangular longitudinal cross section and a supplemental body to support the main body on a given base material and having a substantially rectangular longitudinal cross section narrowed as compared with the longitudinal cross section of the main body, including the steps of forming a polymethylglutarimide layer on a given base material, washing the surface of the polymethylglutarimide layer with an organic solvent, forming a photoresist layer on the polymethylglutarimide layer, exposing and developing the photoresist layer via a given mask, and partially removing the remaining polymethylglutarimide layer with an alkaline water solution, to form the resist pattern.

The inventor had intensely studied to prevent milled wastage from sticking on the side surface walls of the supplemental body of a resist pattern. Then, the inventor found out that the sticking of the milled wastage results from the configuration of the supplemental body, that is, the tapered supplemental bodies 9-2 and 10-2 as shown in FIGS. 4 and 5. Therefore, the inventor had conceived to make vertical the side surface walls of the supplemental body.

The upper region of a PMGI layer can not be thermally polymerized sufficiently, so may be dissolved and removed at higher velocity than the lower region thereof because the dissolution velocity of the un-polymerized region is larger than that of a polymerized region. As a result, the supplemental body made of the PMGI layer is tapered as shown in FIGS. 4 and 5.

In thin point of view, the inventor had conceived to remove the upper region of the PMGI layer beforehand which is not polymerized sufficiently, to make uniform the dissolution velocity of the whole of the PMGI layer. That is, according to the present invention, after a PMGI layer is formed on a given base material, the surface of the PMGI layer is washed by an organic solvent, to remove the un-polymerized region. As a result, the dissolution velocity of the PMGI layer for a developing solution can be made uniform entirely, to make vertical the side surface walls of the supplemental body of the thus obtained resist pattern.

A method for patterning a thin film according to the present invention is characterized by using a resist pattern obtained through the fabricating method of the present invention as mentioned above.

Moreover, a method for manufacturing a micro device according to the present invention is characterized by using the patterning method of the present invention as mentioned above.

In the present invention, the wording "given base material" means a single substrate or a combination of a substrate and an underlayer for a thin film to be milled or a micro device.

BRIEF DESCRIPTION OF THE DRAWINGS

For a better understanding of this invention, reference is made to the attached drawings, wherein.

DETAILED DESCRIPTION OF PREFERRED EMBODIMENTS

This invention will be explained in detail, with reference to the attached drawings, hereinafter.

Figure 1:
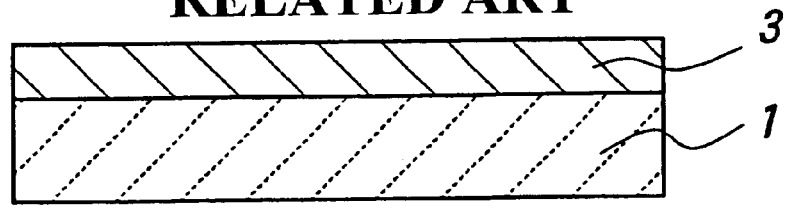
FIG. 1 is a cross sectional view showing a first step of a conventional thin film-patterning method.
Figure 2:
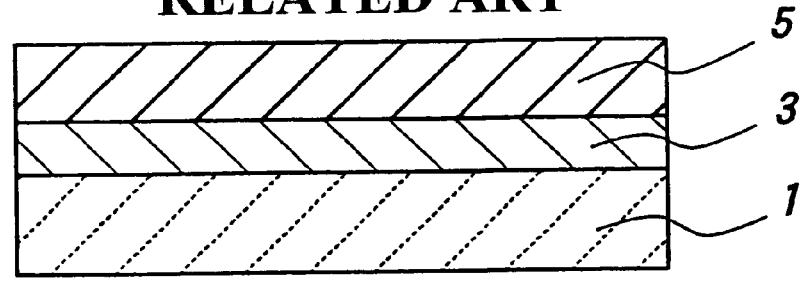
FIG. 2 is a cross sectional view showing the next step after the first step shown in FIG. 1.
Figure 3:
FIG. 3 is a cross sectional view showing the next step after the step shown in FIG. 2.
Figure 3:
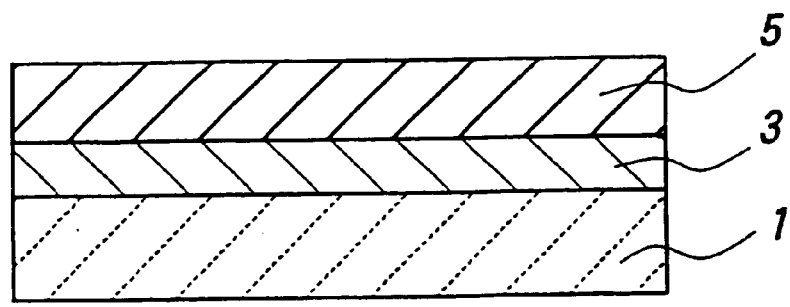
Figure 4:
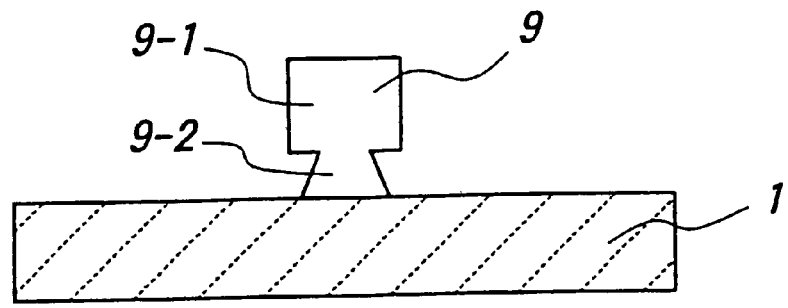
FIG. 4 is a cross-sectional view showing a conventional resist pattern.
Figure 5:
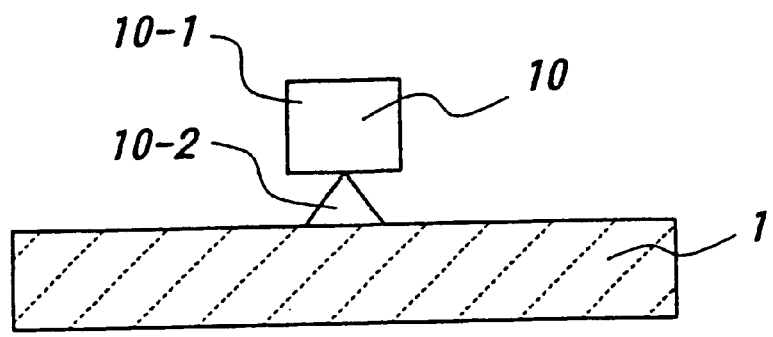
FIG. 5 is a cross-sectional view showing another conventional resist pattern.
Figure 6:
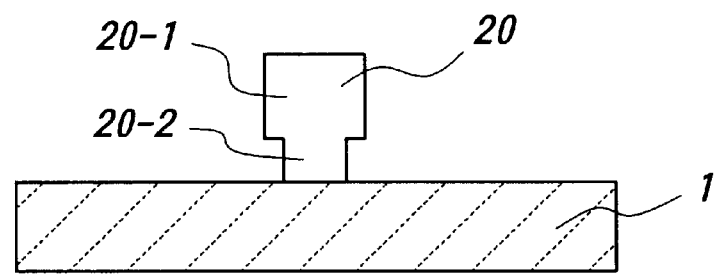
FIG. 6 is a cross-sectional view showing a resist pattern obtained through a fabricating method according to the present invention.

FIG. 6 is a cross-sectional view showing a resist pattern obtained through a fabricating method according to the present invention. A resist pattern 20 depicted in FIG. 6 includes a main body 20-1 having a substantially rectangular longitudinal cross section and a supplemental body 20-2 having a substantially rectangular longitudinal cross section to support the main body 20-1 on a given base material which is narrowed as compared with the main body 20-1. As a result, the resist pattern has a rectangular T-shape entirely.

In the resist pattern 20 in FIG. 6, the side surface walls of the supplemental body 20-2 are made vertical. Therefore, the sticking of milled wastage can be repressed, and thus, the resist pattern 20 can be easily dissolved and removed. The enlargement of the bottom portion in width can be prevented, and thus, the patterning condition of a thin film is not almost affected. Then, the main body 20-1 can be strongly supported by the supplemental body 20-2, and thus, the resist pattern 20 is not almost broken away in patterning a thin film.

The resist pattern 20 can be made through normal exposing and developing treatment for a two-layered structure of a PMGI layer and a photoresist layer. However, it is required that the surface of the PMGI layer is washed by an organic solvent before the photoresist layer is formed, according to the present invention.

It is desired that the organic solvent is composed of the solvent for the resist material to constitute the photoresist layer, particularly of the solvent containing the resist material. In this case, if the organic solvent remains in between the main body and the supplemental body of a resist pattern, it does not affect the properties of the resist pattern because it comes to contain a component of the photoresist layer of the supplemental body. For example, the break away of the main body due to the shear force from the organic solvent can be prevented effectively.

As the organic solvents are exemplified ethyl cellosolve acetate (ECA), ethylene glycol monomethyl ether, ethylene glycol monoethyl ether, methyl cellosolve acetate, diethylene glycol monomethyl ether, diethylene glycol monoethyl ether, propylene glycol methyl ether, propylene glycol propyl ether acetate, ethyl lactate, methyl ethyl ketone, cyclohexane, 2-dihydroxy ethyl propionate, 2-hydroxy-2-methyl ethyl propionate, and a mixture thereof.

Next, a patterning method of a thin film using the above-mentioned resist pattern, according to the present invention, will be described. FIGS. 7–12 are cross sectional views showing patterning steps by a milling method in the patterning method of the present invention, including the fabricating steps of a resist pattern according to the present invention.

Figure 7:
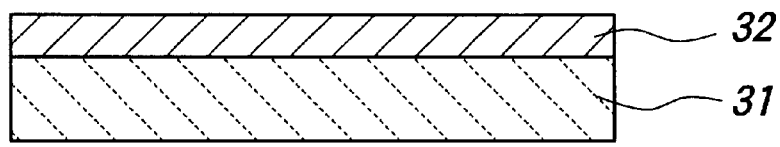
FIG. 7 is a cross sectional view showing a first step in a fabricating method according to the present invention.
Figure 8:
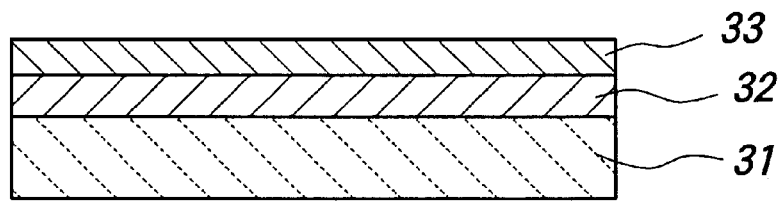
FIG. 8 is a cross sectional view showing the step after the step shown in FIG. 7.

First of all, as shown in FIG. 7, a thin film 32 to be milled is formed on a substrate 31 by a sputtering method or the like. Then, as shown in FIG. 8, a PMGI layer 33 is coated on the thin film 32 to be milled, and subsequently, the surface of the PMGI layer 33 is washed with an organic solvent as mentioned above, to remove not thermally polymerized portions thereof. Prior to the washing treatment, heating treatment may be performed for the PMGI layer 33 as occasion demands.

Figure 9:
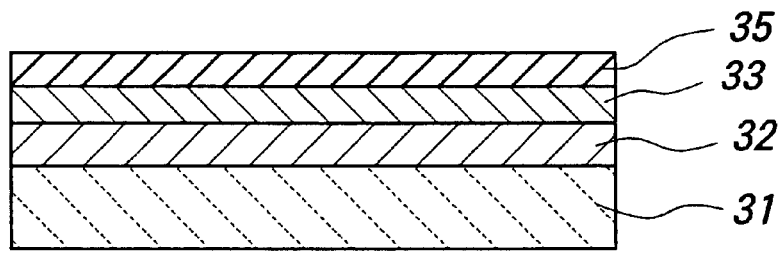
FIG. 9 is a cross sectional view showing the step after the step shown in FIG. 8.
Figure 10:
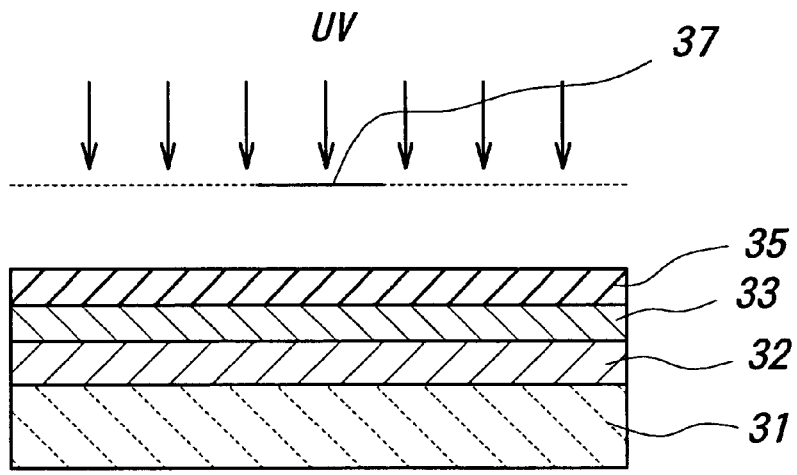
FIG. 10 is a cross sectional view showing the step after the step shown in FIG. 9.
Figure 11:
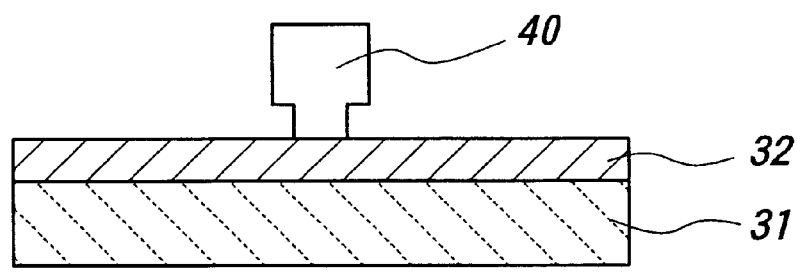
FIG. 11 is a cross sectional view showing the step after the step shown in FIG. 10.

Then, as shown in FIG. 9, a photoresist layer 35 of e.g., positive type is coated on the PMGI layer 33. Thereafter, as shown in FIG. 10, the photoresist layer 35 is exposed via a given mask 37 through UV irradiation or the like, and developed. The remaining PMGI layer 33 is removed with an alkaline solution, to form a resist pattern 40 as shown in FIG. 11.

Figure 12:
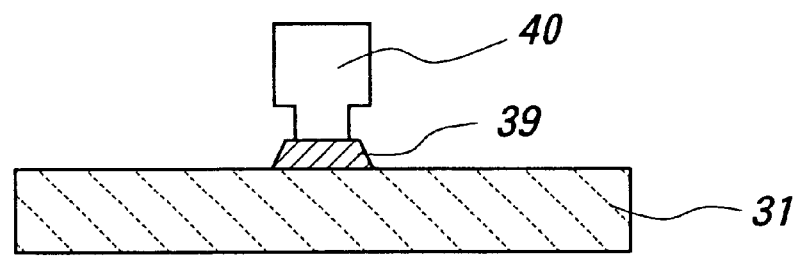
FIG. 12 is a cross sectional view showing the step after the step shown in FIG. 11.

Subsequently, the thin film to be milled is milled via the resist pattern 40. The thin film 32 is patterned minutely, to form a minute patterned thin film 39 as shown in FIG. 12. The resist pattern 40 is dissolved and removed with a solvent.

Next, a patterning method of a thin film using the above-mentioned resist pattern and a lift-off method, according to the present invention, will be described. FIGS. 13–17 are cross sectional views showing the fabricating steps according to the patterning method.

Figure 13:
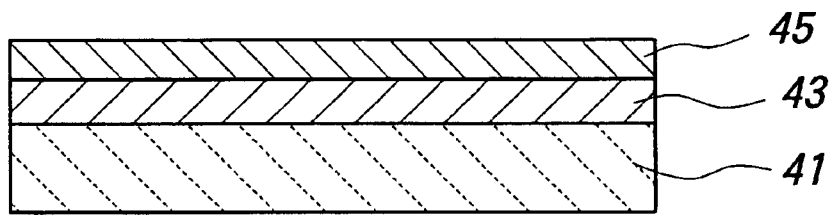
FIG. 13 is a cross sectional view showing a first step in another fabricating method according to the present invention.

First of all, as shown in FIG. 13, a PMGI layer 43 is coated on a substrate 41, and a photoresist layer 45 of e.g., positive type is coated on the PMGI layer 43 after the surface of the PMGI layer 43 is cleaned with an organic solvent. Prior to the cleaning with the organic solvent, the PMGI layer may be heated as occasion demands.

Figure 14:
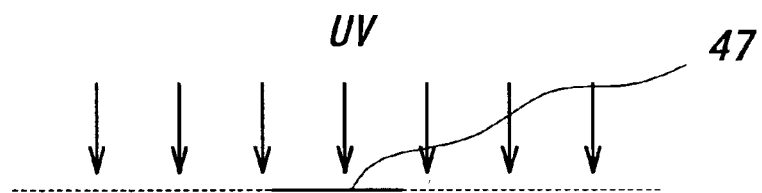
FIG. 14 is a cross sectional view showing the step after the step shown in FIG. 13.
Figure 14:
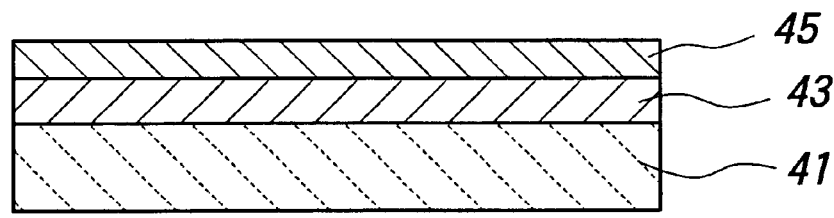
Figure 15:
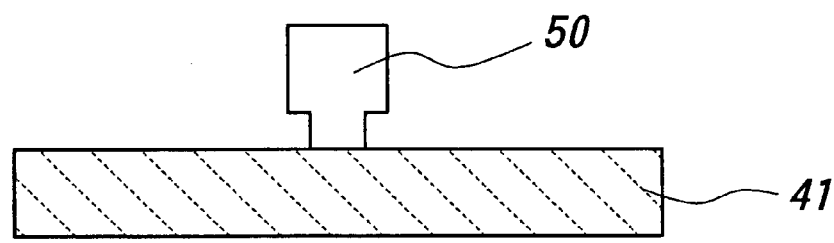
FIG. 15 is a cross sectional view showing the step after the step shown in FIG. 14.

Then, as shown in FIG. 14, the photoresist layer 45 is exposed via a given mask 47 through UV irradiation or the like, and developed. Thereafter, the remaining PMGI layer 43 is partially removed with an alkaline solution, to form a resist pattern 50 as shown in FIG. 15.

Figure 16:
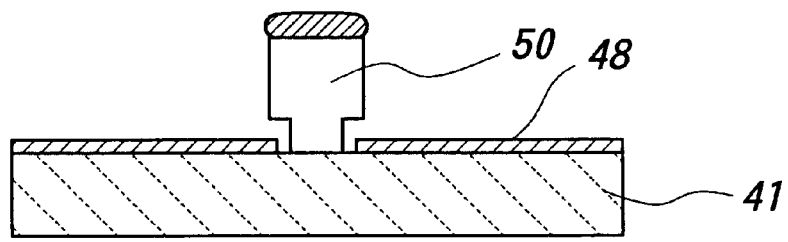
FIG. 16 is a cross sectional view showing the step after the step shown in FIG. 15.
Figure 17:
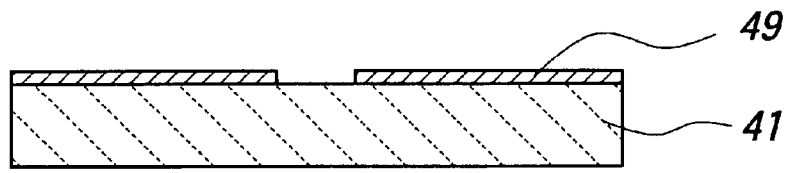
FIG. 17 is a cross sectional view showing the step after the step shown in FIG. 16.

Then, as shown in FIG. 16, a thin film 48 to be patterned is formed on the substrate 41 so as to cover the resist pattern 50. Thereafter, as shown in FIG. 17, the resist pattern 50 is dissolved and removed with a given organic solvent, to form a patterned thin film 49.

Figure 18:
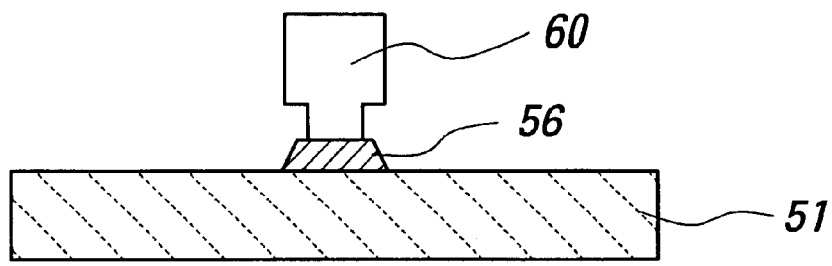
FIG. 18 is a cross sectional view showing a first step in still another fabricating method according to the present invention.
Figure 19:
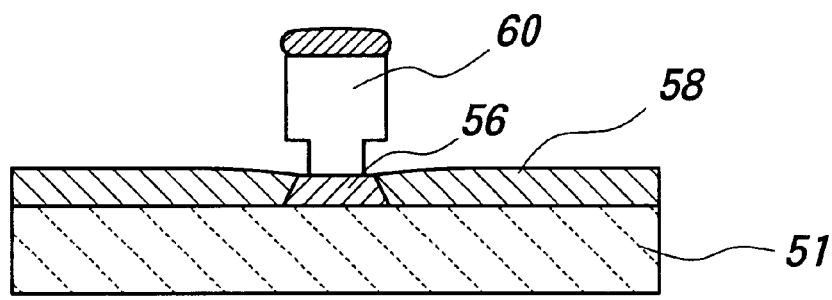
FIG. 19 is a cross sectional view showing the step after the step shown in FIG. 18.
Figure 20:
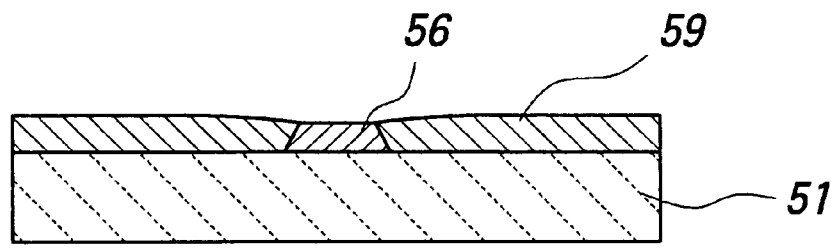
FIG. 20 is a cross sectional view showing the step after the step shown in FIG. 19.

Next, a patterning method of a thin film using the above-mentioned resist pattern and a combination method of milling and lift-off, according to the present invention, will be described. FIGS. 18–20 are cross sectional views showing the fabricating steps according to the patterning method.

First of all, according to the fabricating steps using a milling method as shown in FIGS. 7–12, a pre-patterned thin film 56 and a resist pattern 60 are formed on a substrate 51 as shown in FIG. 18. Then, according to the fabricating step using a lift-off method as mentioned above, a thin film 58 to be patterned is formed on the substrate 51 so as to cover the resist pattern 60, as shown in FIG. 19. Thereafter, the resist pattern 60 is dissolved and removed, to form a patterned thin film 59, as shown in FIG. 20.

The resist pattern-fabricating method and the thin film-patterning method according to the present invention may be preferably employed for a micro device such as a semiconductor laser, an optical isolator, a micro actuator and a thin film magnetic head. Particularly, these methods are preferably employed for a thin film magnetic head requiring miniaturization in light of high density recording/reproducing.

Next, a fabrication process of a giant magnetophotoresistive effective element (hereinafter, often abbreviated as "GMR element") of a thin film magnetic head using the resist pattern-fabricating method and the thin film-patterning method will be described. FIGS. 21–24 are fabrication process charts of the GMR element, and show the cross sectional views, taken on the line parallel to the ABS of the magnetic pole portion (parallel direction to the medium opposing surface).

Figure 21:
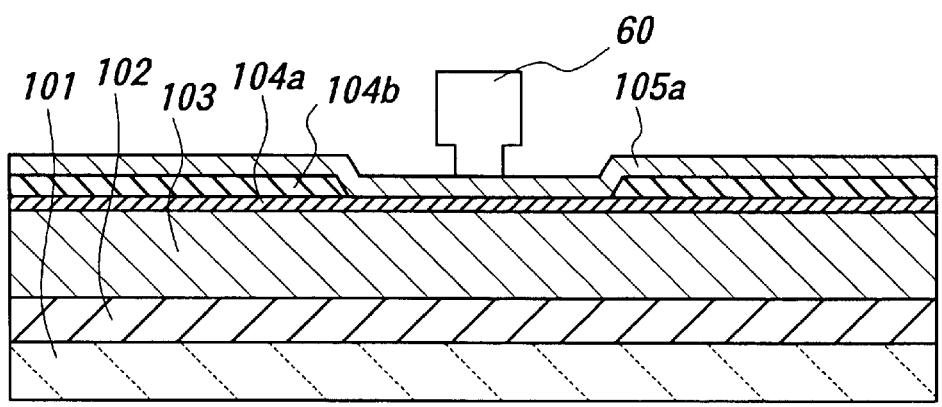
FIG. 21 is a cross sectional view showing a manufacturing step of a thin film magnetic head using a resist pattern-fabricating method and a thin film-patterning method according to the present invention.

First of all, as shown in FIG. 21, an insulating layer 102 is formed of alumina ($Al_2O_3$), etc., on a substrate 101 made of AlTiC ($Al_2O_3$.TiC). Then, a bottom shielding layer 103 for the playback head is formed of a magnetic material on the insulating layer 102. Then, a first shielding gap thin film 104a is formed of an insulating material such as alumina on the bottom shielding layer 103.

Then, a second shielding gap thin film 104b is formed of an insulating material such as alumina, except the area for the GMR element to be formed, on the first shielding gap thin film. Then, a magnetic layer 105a to be fabricated as the GMR element is formed on the second shielding gap thin film 104b. Subsequently, a resist pattern 60 is formed on the area for the GMR element to be formed according to the process shown in FIGS. 7–12.

Figure 22:
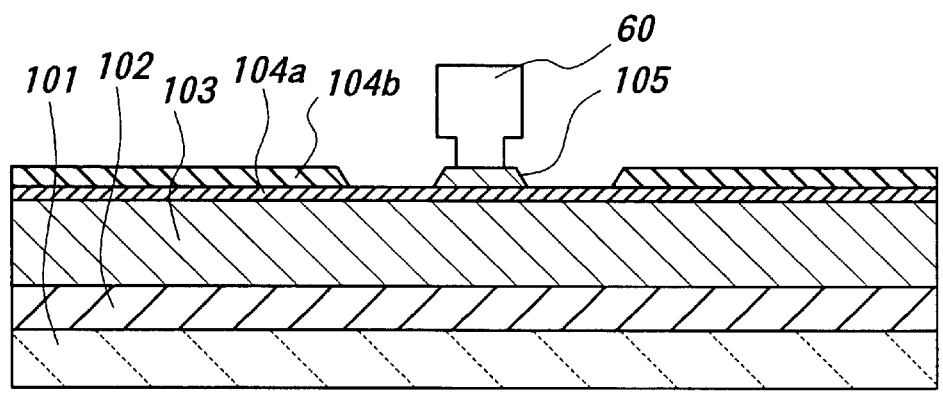
FIG. 22 is a cross sectional view showing the next step after the step shown in FIG. 21.

Then, as shown in FIG. 22, the magnetic layer 105a is selectively etched by ion milling using the resist pattern 60 as a mask, to form the GMR element 105. Next, as shown in FIG. 23, a pair of leading layers 106 to be electrically connected to the GMR element are formed entirely on the first shielding gas thin film 104a, the second shielding gap thin film 104 and the resist pattern 60, according to the fabricating step shown in FIG. 19.

Figure 23:
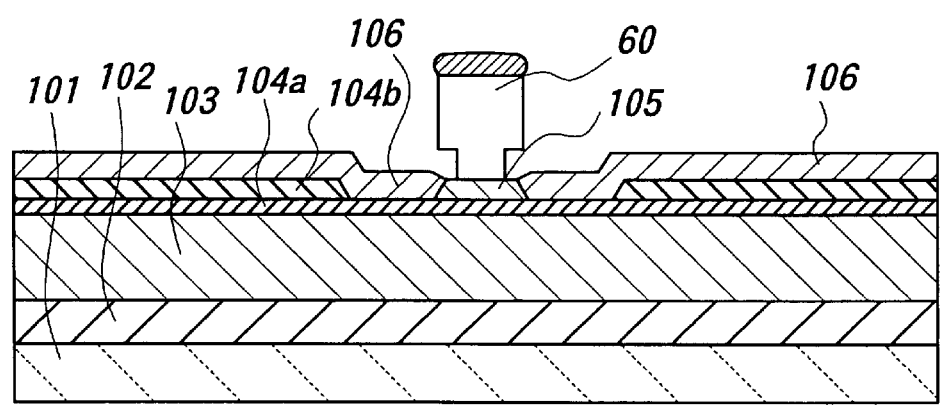
FIG. 23 is a cross sectional view showing the next step after the step shown in FIG. 22.

That is, in the fabricating steps shown in FIGS. 21–23, a combination method of milling and lift-off is employed to fabricate the patterned thin film constructed of the GMR element 105 and the pair of leading layers 106.

Figure 24:
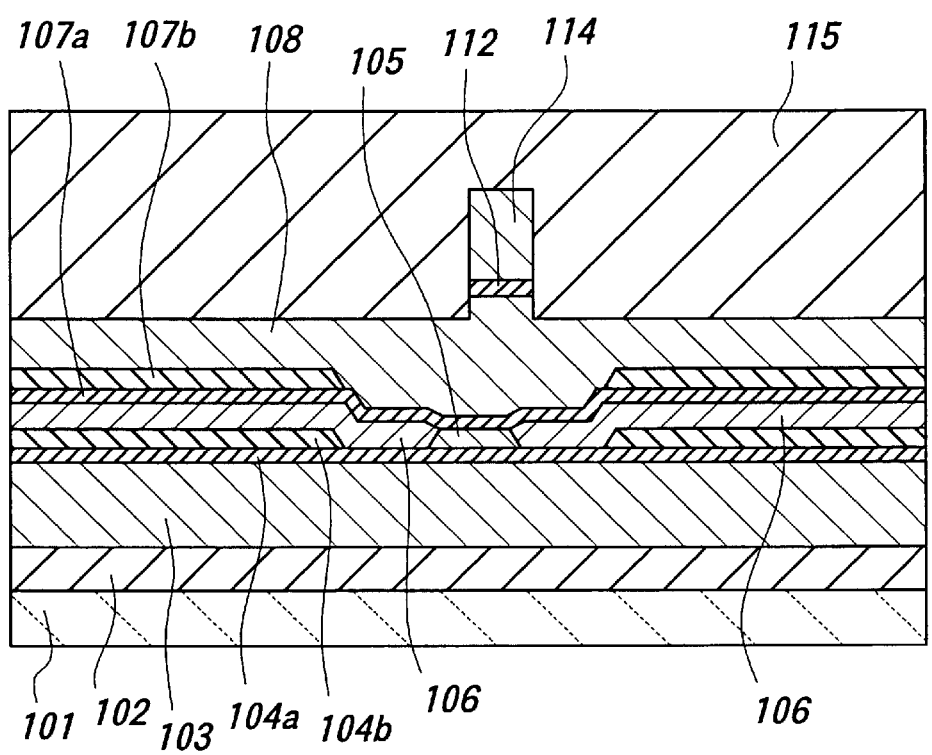
FIG. 24 is a cross sectional view showing the next step after the step shown in FIG. 23.

Then, as shown in FIG. 24, a third shielding gap thin film 107a is formed of an insulating material such as alumina on the shielding gap thin films 104a, 104b, the GMR element 105 and the leading layers 106, and the GMR element 105 is embedded in between the shielding gap thin films 104a and 107a. Subsequently, except the nearby area to the GMR element 105, a fourth shielding gap thin film 107b is formed of an insulating material such as alumina on the third shielding gap thin film 107a.

Thereafter, a bottom magnetic layer 108 as a top shielding layer, a write gap layer 112, a top magnetic layer 114, not shown a thin film coil and a protective layer 115 are formed in turn, and the ABS is polished, thereby to complete a thin film magnetic head. In FIG. 23, the side surfaces of the top shielding layer is self-aligned to construct the trim structure.

This invention has been described in detail with reference to the above preferred concrete embodiments, but it is obvious for the ordinary person skilled in the art that various modifications can be made in its configuration and detail without departing from the scope of this invention.

As mentioned above, according to the resist pattern-fabricating method of the present invention, the side surface walls of the supplemental body of the thus obtained resist pattern can be made vertical easily. Therefore, a given organic solvent can be penetrated into the supplemental body through the prevention of the stuck wastage of milling, and thus, the resist pattern can be easily removed. Moreover, the enlargement of the bottom portion of the supplemental body can be prevented effectively. As a result, a patterning for a thin film is not almost affected by the supplemental body, and thus, precise patterning of a thin film can be carried out.

Also, the main body of the resist pattern can be supported by the supplemental body strongly, and thus, the break off of the main body can be prevented effectively. In this case too, precise patterning of a thin film can be carried out.

What is claimed is:

1. A method for fabricating a resist pattern having a T-shaped longitudinal cross section which is constructed of a main body having a substantially rectangular longitudinal cross section and a supplemental body to support the main body on a given base material and having a substantially rectangular longitudinal cross section narrowed as compared with the longitudinal cross section of the main body, comprising the steps of:

forming a polymethylglutarimide layer on a given base material, washing the surface of the polymethylglutarimide layer with an organic solvent, forming a photoresist layer on the polymethylglutarimide layer, exposing and developing the photoresist layer via a given mask, and partially removing the remaining polymethylglutarinide layer with an alkaline water solution, to form the resist pattern.

2. A fabricating method as defined in claim 1, wherein the organic solvent is made of the solvent for the resist material to constitute the photoresist layer.

3. A fabricating method as defined in claim 2, wherein the organic solvent is made of the solvent containing the resist material to constitute the photoresist layer.

4. A method for patterning a thin film, comprising the steps of:

forming a thin film to be milled on a given base material, forming a polymethylglutarimide layer on the thin film to be milled, washing the surface of the polymethylglutarimide layer with an organic solvent, forming a photoresist layer on the polymethylglutarimide layer, exposing and developing the photoresist layer via a given mask, partially removing the remaining polymethylglutarinide layer with an alkaline water solution, to form a resist pattern having a T-shaped longitudinal cross section which is constructed of a main body having a substantially rectangular longitudinal cross section and a supplemental body to support the main body on a given base material and having a substantially rectangular longitudinal cross section narrowed as compared with the longitudinal cross section of the main body, and milling the thin film to be milled via the resist pattern, to form a patterned thin film.

5. A patterning method as defined in claim 4, wherein the organic solvent is made of the solvent for the resist material to constitute the photoresist layer.

6. A patterning method as defined in claim 5, wherein the organic solvent is made of the solvent containing the resist material to constitute the photoresist layer.

7. A method for manufacturing a micro device, using a patterning method of a thin film as defined in claim 4.

8. A manufacturing method as defined in claim 7, wherein the micro device is a thin film magnetic head.

9. A manufacturing method as defined in claim 8, wherein the magnetoresistive effective type thin film element of the thin film magnetic head is manufactured by a method for patterning a thin film, comprising the steps of:

forming a thin film to be milled on a given base material, forming a polymethylglutarimide layer on the thin film to be milled, washing the surface of the polymethylglutarimide layer with an organic solvent, forming a photoresist layer on the polymethylglutarimide layer, exposing and developing the photoresist layer via a given mask, partially removing the remaining polymethylglutarinide layer with an alkaline water solution, to form a resist pattern having a T-shaped longitudinal cross section which is constructed of a main body having a substantially rectangular longitudinal cross section and a supplemental body to support the main body on a given base material and having a substantially rectangular longitudinal cross section narrowed as compared with the longitudinal cross section of the main body, and milling the thin film to be milled via the resist pattern, to form a patterned thin film.

10. A method for patterning a thin film, comprising the steps of:

forming a polymethylglutarimide layer on a given base material, washing the surface of the polymethylglutarimide layer with an organic solvent, forming a photoresist layer on the polymethylglutarimide layer, exposing and developing the photoresist layer via a given mask, partially removing the remaining polymethylglutarinide layer with an alkaline water solution, to form a resist pattern having a T-shaped longitudinal cross section which is constructed of a main body having a substantially rectangular longitudinal cross section and a supplemental body to support the main body on a given base material and having a substantially rectangular longitudinal cross section narrowed as compared with the longitudinal cross section of the main body, forming a thin film to be patterned on the base material so as to cover the resist pattern, and lifting-off the resist pattern, to form a patterned thin film.

11. A patterning method as defined in claim 10, wherein the organic solvent is made of the solvent for the resist material to constitute the photoresist layer.

12. A method for patterning a thin film, comprising the steps of:

forming a thin film to be milled on a given base material, forming a polymethylglutarimide layer on the thin film to be milled, washing the surface of the polymethylglutarimide layer with an organic solvent, forming a photoresist layer on the polymethylglutarimide layer, exposing and developing the photoresist layer via a given mask, partially removing the remaining polymethylglutarinide layer with an alkaline water solution, to form a resist pattern having a T-shaped longitudinal cross section which is constructed of a main body having a substantially rectangular longitudinal cross section and a supplemental body to support the main body on a given base material and having a substantially rectangular longitudinal cross section narrowed as compared with the longitudinal cross section of the main body, milling the thin film to be milled via the resist pattern, to form a pre-patterned thin film, forming a thin film to be patterned on the base material so as to cover the resist pattern, and lifting-off the resist pattern, to form a patterned thin film including the pre-patterned thin film.

13. A patterning method as defined in claim 12, wherein the organic solvent is made of the solvent for the resist material to constitute the photoresist layer.

14. A method for manufacturing a micro device, using a patterning method of a thin film as defined in claim 10.

15. A method for manufacturing a micro device, using a patterning method of a thin film as defined in claim 12.

16. A method for manufacturing a micro device, using a patterning method of a thin film as defined in claim 5.

17. A method for manufacturing a micro device, using a patterning method of a thin film as defined in claim 6.

* * * * *